United States Patent [19]
Hallford

[11] 4,099,126
[45] Jul. 4, 1978

[54] FREQUENCY CONVERTER APPARATUS
[75] Inventor: Ben R. Hallford, Wylie, Tex.
[73] Assignee: Rockwell International Corporation, El Segundo, Calif.
[21] Appl. No.: 740,903
[22] Filed: Nov. 11, 1976
[51] Int. Cl.² .......................... H04B 1/26; H03D 7/14
[52] U.S. Cl. ..................................... 325/446; 325/449; 333/84 M
[58] Field of Search ............... 325/437, 442, 445, 446, 325/449, 435, 388; 329/153, 154; 333/84 M

[56]   References Cited
U.S. PATENT DOCUMENTS

| 3,681,697 | 8/1972 | Moroney | 325/446 |
| 3,950,703 | 4/1976 | Reindel | 325/446 |

Primary Examiner—Robert L. Griffin
Assistant Examiner—Marc E. Bookbinder
Attorney, Agent, or Firm—Bruce C. Lutz; Robert J. Crawford; L. Lee Humphries

[57]   ABSTRACT

A dual balanced mixer frequency converter is disclosed which provides a low conversion loss by reactively terminating one of the leads on a combiner circuit such that all the image frequency signal power and/or part of the reflected receiver power is returned to the mixer. If this termination appears reactive at the image frequency response looking out from the mixer diode terminals, it will also reduce the noise appearing in the IF output signal.

8 Claims, 6 Drawing Figures

FREQUENCY CONVERTER APPARATUS

THE INVENTION

The present invention is generally related to electronics and more specifically related to frequency conversion apparatus of the balanced mixer type.

As will be known to those skilled in the art, it has been shown theoretically that half of the signal (incoming) power being converted is used to generate in image frequency and the rest used to generate the intermediate (IF) frequency with the image frequency power usually being lost or wasted. Specifically, in a down-converter, the image frequency signal that is generated on the opposite side of the local oscillator (LO) frequency signal from the input signal frequency represents half the power used in the conversion process from the input signal frequency power to the intermediate (IF) signal power output. If the occurrence of this image frequency could be prevented or if the image frequency could be returned to the mixer and its power totally transferred to an output IF signal that is in phase with the desired output IF signal, the efficiency of the circuit could be considerably improved. Under ideal conditions (no diode or other circuit losses), the conversion loss of the mixer (conversion loss being defined as the difference in the receive signal power and the output IF signal power) may be cut in half (reduced by three dB) by eliminating image frequency signal power loss.

Likewise, in a prior art up-converter, the input IF signal causes two equal level sidebands to be generated on either side of the radio frequency (RF) pump carrier. Only one of these two sidebands is utilized and thus the other sideband (representing half of the power) is wasted. If this other sideband could be prevented from being generated or if the power in the unused sideband could be totally reclaimed, then the power of the desired output sideband would be doubled. This again would result in increasing the efficiency of the circuit by lowering the conversion loss from pump power input to RF sideband power output by an ideal figure of 3 dB.

The down-converter circuit has an additional requirement to be satisfied over that required for the up-converter. The measure of performance for the mixer in the down-converter is its noise figure. The noise figure is defined as the ratio of the signal-to-noise at the output of the mixer as compared to the signal-to-noise at the input of the mixer. This figure involves both conversion efficiency in the mixing process and the noise generated in the mixer. The return of the image power to the mixer improves the conversion loss but may not necessarily improve the noise level from the mixer. The conversion process in the mixer allows signals that are located above or below the LO frequency by the IF frequency to be converted to usable output. The image frequency signal response (which is the undesired response) usually contributes the same noise level to the output that the desired response contributes. A solution presented by this disclosure is to place a reactive or at least partially reactive termination, as seen by the mixer diode terminals, at the image signal frequency so as to lower its noise power contribution to the usable IF output.

As will be determined from later discussions, the design of the present circuit is such that the image frequency signal and a portion of the reflected received signal are routed to a line that ideally contains these two signals. Therefore, this line may be reactively terminated to reflect the image frequency signal back to the two balanced mixers and the phase of this return signal may be changed by changing the electircl length of this line. This individual line causes a partially reactive load to appear at the mixer terminals when it is reactively terminated so as to suppress noise in the output signal.

Although the prior art contains information on how to provide means to reclaim the frequency product power to lower the conversion loss on a limited frequency spectrum band basis as described in U.S. Pat. No. 3,831,097 and although a microwave balanced mixer circuit somewhat similar to this was presented by T. H. Oxley at the 1976 IEEE MTT Symposium on June 15, 1976, the present product return mixer circuit is believed to be an improvement over all known prior art in conversion efficiency and noise characteristics.

It is, therefore, an object of the present invention to provide an improved dual balanced frequency converter or product return mixer apparatus.

Other objects and advantages of the present invention may be ascertained from a reading of the specification and appended claims in conjunction with drawings wherein:

FIGS. 1(a) and 1(b) are an illustration of a single ended mixer using microstrip techniques and its electrical equivalent.

DETAILED DESCRIPTION

Figure 1A:
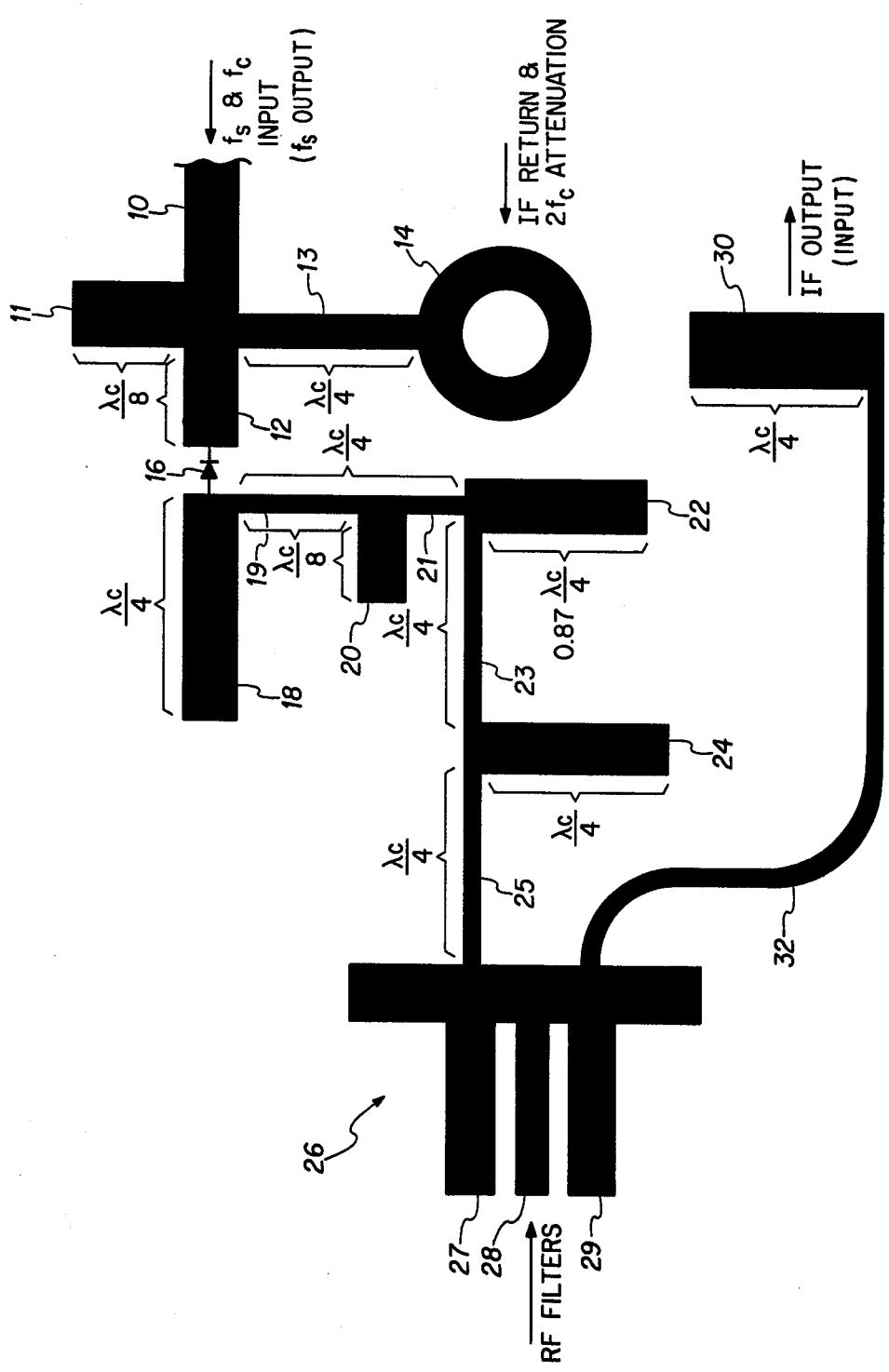

In FIG. 1(a), a signal is applied to an input transmission line 10 which is connected to a filter stub 11, an output line 12, and is connected via a lead 13 to a ground terminal 14. A diode 16 is interconnected between stub line 12 and a stub 18 which is connected via a lead 19, a stub 20 and a lead 21 to a stub 22. Stub 22 is connected by a lead 23 to a stub 24 and is further connected by a lead 25 to an RF filter 26. RF filter 26 contains three stubs 27, 28, and 29 and is connected to an output terminal 30 by a lead 32.

In this circuit, stubs and transmission line segments which are designated as $\lambda c/8$ shall be taken to be equivalent to one-quarter the wavelength of the second harmonic of the LO signal $f_c$. Throughout this specification, various line segments and stubs will be described relative to the center frequency of the band of frequencies covered by the LO signal $f_c$ for convenience. However, it should be noted that $f_o$, $f_s$ and $f_i$ are closely related in signal frequency in the embodiment being described. It should also be noted that the wavelength normally used in defining line segment lengths is, in site of the above, related directly to the center frequency of the band of frequencies defined by the received signal $f_s$. As illustrated, the segments 11, 12, 19 and 20 also fall within this categorization. The leads 13, 23 and 25, as well as the total length of leads 19 and 21, are designed to be $\lambda c/4$ or one-fourth the wavelength of $f_c$. The stubs 18, 24, 27, 28, 29 and 30 are also one-quarter the wavelength of $f_c$. As will be explained further in the text, the stub 22 is trimmed from λc/4 to a value which produces minimum amplitude $2f_c$ signals at output 30. In the embodiment shown, this value is 0.87 of one-quarter wavelength.

Figure 1B:
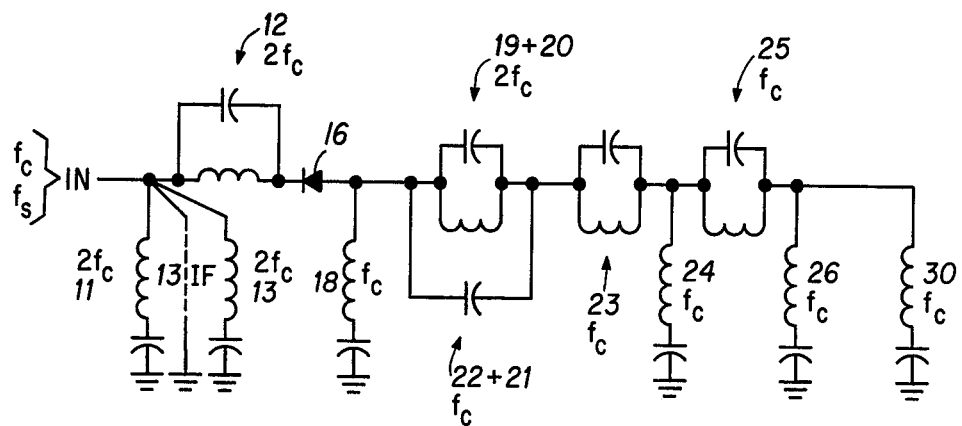

FIG. 1(b) represents a low frequency electrica equivalent circuit of the mixer of FIG. 1(a).

Figure 2:
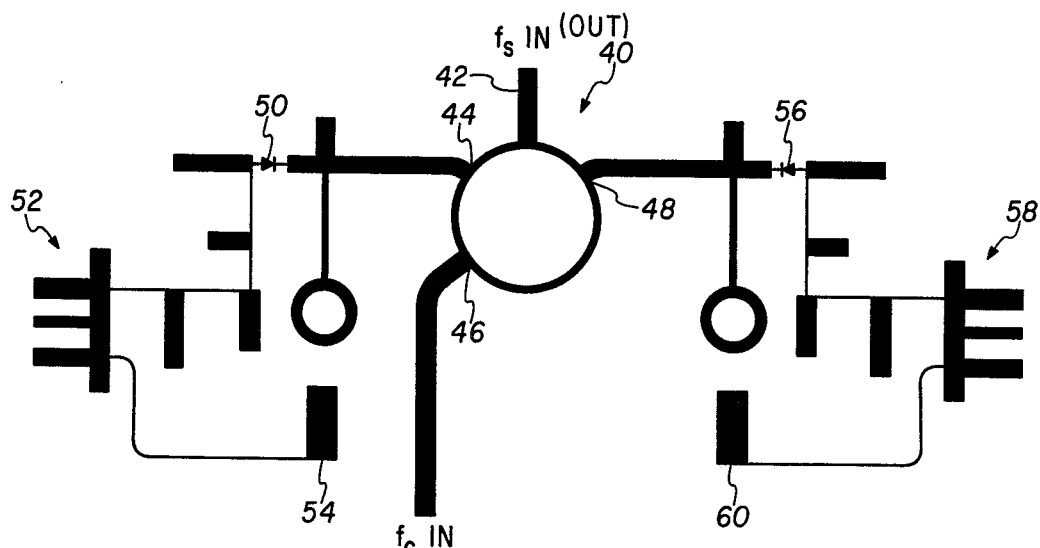
FIG. 2 is a single balanced mixer utilizing microstrip techniques.

In FIG. 2, a rat-race of 180° hybrid designated as 40 is shown with ports or terminals 42, 44, 46 and 48. The signals from terminal 44 are operated upon in the section containing diode 50 wherein signals are generated which are passed through an RF filter 52 before being output at an IF output terminal 54. Signals from port 48 are similarly generated and passed relative to diode 56 and through a filter generally designated as 58 on their way to a further IF output 60. As illustrated, port 42 provides an input signal and port 46 provides an input for the local oscillator or carrier signal when the mixer is used as a down-converter. More information on single balanced mixers using microstrips can be obtained from various publications including my U.S. Pat. No. 3,870,960 issued Mar. 16, 1976 and assigned to the same assignee as the present invention.

Figure 3:
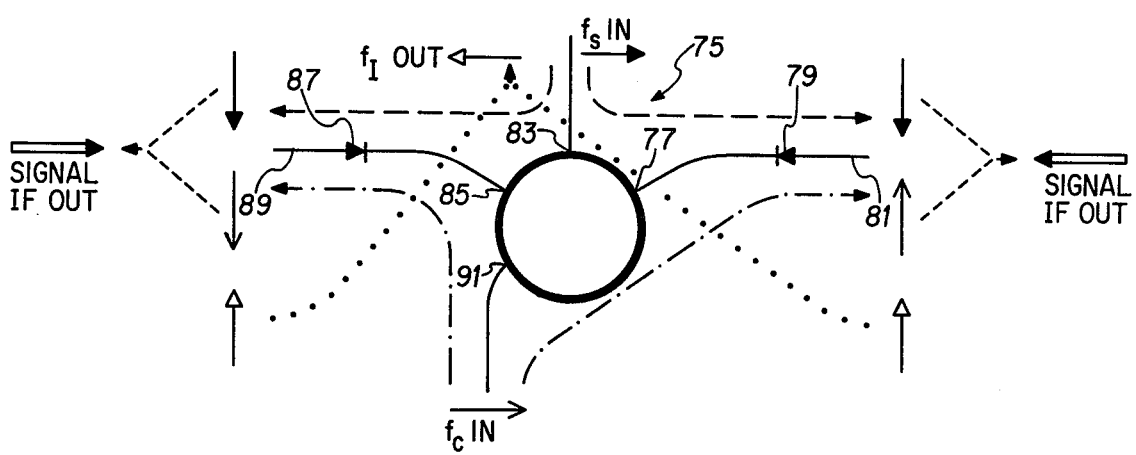
FIG. 3 is a diagram illustrating the characteristic signals in a rat-race hybrid and associated mixer diodes.

Although there is much information on rat-race hybrids, FIG. 3 illustrates the relative phase of input signals applied as illustrated and obtained from the ports illustrated. In this Figure, a rat-race hybrid 75 has a port 77 connected through a diode 79 to a terminal 81. Image frequency ($f_i$) signals of the relative phase illustrated by the open head arrows are generated in diodes 79 and 87 and are output at port 83. A port 83 receives input signals ($f_s$) with the phase shown by the solid arrowhead while a port 85 is connected through a diode 87 to an intermediate frequency output terminal 89. (In actuality, 81 and 89 are shorts to ground for $f_s$, $f_c$ and $f_i$ signals.) A final terminal 91 receives local oscillator or carrier frequency signals ($f_c$) of the phase shown by the open barb arrow. As will be realized, each of the ports that are close together are substantially one-quarter wavelength of the LO signal $f_c$. The terminals 77 and 91, on the other hand, are three-quarters wavelength apart as compared to the LO frequency signal. As known, discussing rat-race hybrids in general, if an input signal is applied to either of terminals 83 or 85 the outputs will be obtained from adjacent rms displaced 90° from the input signal and will be in-phase. However, if an input is applied to either of arms 77 or 91, they will appear on adjacent arms in quadrature phase with the input signal, but of opposite phase to each other.

As illustrated in FIG. 3, the IF output signals are 180° out-of-phase. The two signals can be made in-phase by merely reversing the direction of connection or the polarity of one of the diodes 79 and 87.

Figure 4:
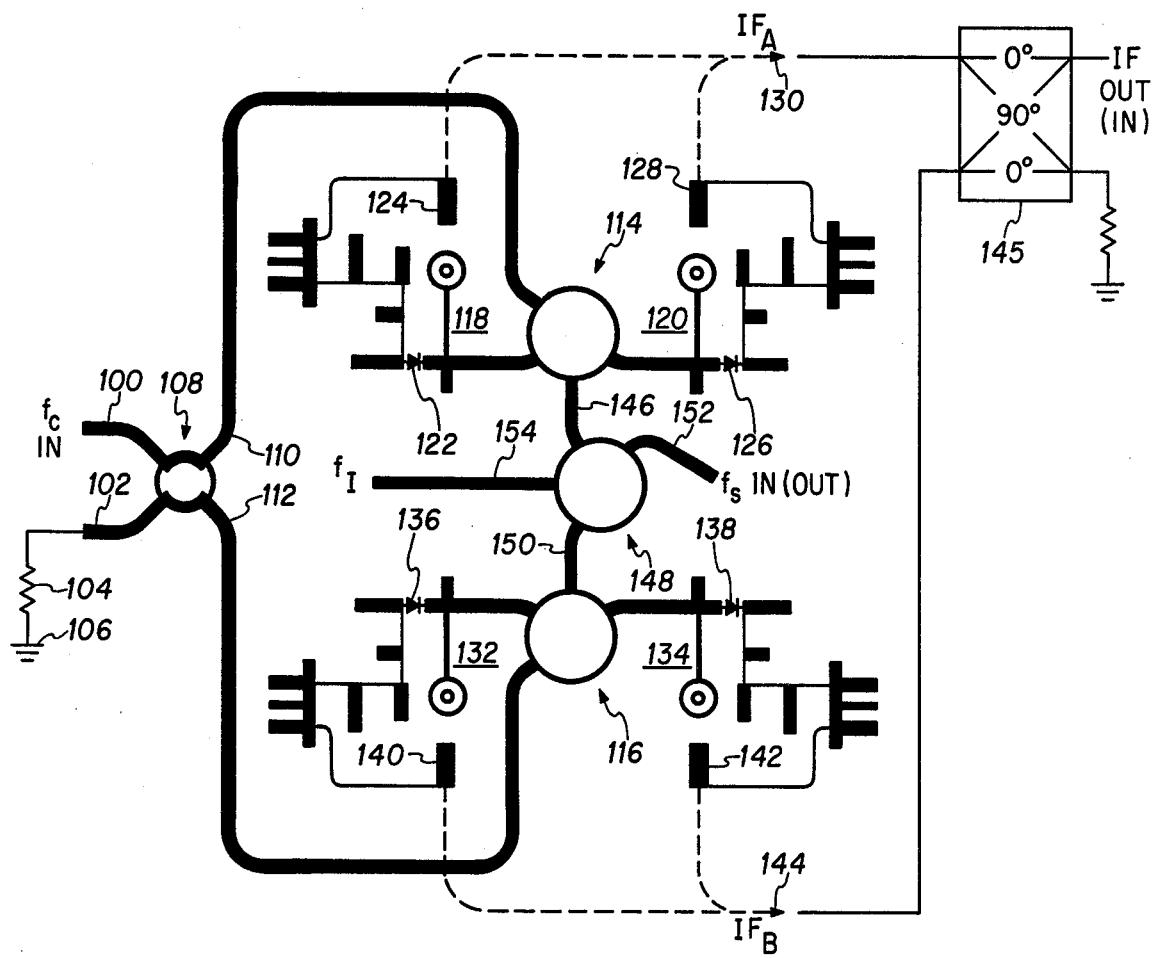
FIG. 4 is an illustration of a frequency converter utilizing the teachings of this invention in the preferred embodiment of this invention with microstrip techniques.

In FIG. 4, the layout of a microstrip circuit utilizing the teachings of the present invention is illustrated with a local oscillator or $f_c$ input signal applied to lead 100 while a further lead 102 is connected through an external resistor 104 to ground or reference potential 106. The two leads 100 and 102 are connected to quadrature signal splitter 108 which has output leads 110 and 112 that have equal output that are 90° out-of-phase. Lead 110 goes to a rat-race circuit generally designated as 114 while lead 112 feeds a rat-race circuit 116. The rat-race 114 is part of a balanced mixer configuration wherein one portion of the balanced mixer is designated as 118 and the other portion is designated as 120. Mixer 118 includes a diode 122 and an output terminal 124. Mixer 120 includes a diode 126 and a further output terminal 128. The output terminals 124 and 128 are connected to a common output externally and designated as 130. Rat-race 116 also contains a pair of balanced mixer portions 132 and 134. Mixer 132 has a diode 136 while a diode 138 is contained in mixer 134. The mixers 132 and 134 have outputs 140 and 142, respectively, which are connected together externally to an output terminal 144. It will be noted that the output terminals 130 and 144 are labeled $IF_A$ and $IF_B$ respectively, and are connected to inputs of a quadrature signal combiner 145. The rat-race 114 has an output lead 146 connected to a rat-race generally designated as 148 and used as a combiner. Rat-race 116 has a connecting lead 150 also connected to combiner 148. Further terminals of combiner 148 are an $f_s$ or signal frequency lead 152 and a termination lead 154 used as a reactive circuit (short or open) to the frequency product returned signals to give the effect of a high impedance to those signals as seen by each of the diodes 122, 126, 136 and 138. The line segment or stub 154 must be of such length that the return path to the diodes causes the phase of the frequency product returned signals which beat with the LO $f_c$ to generate further IF component signals whose phase is identical to the phase of the IF component signals originally generated simultaneous with the generation of image frequency signals. Usually the total signal path length will be either an integral number of half wavelengths or an odd number of one-quarter wavelengths in accordance with design options of using open circuit termination or short circuit termination, respectively.

Figure 5:
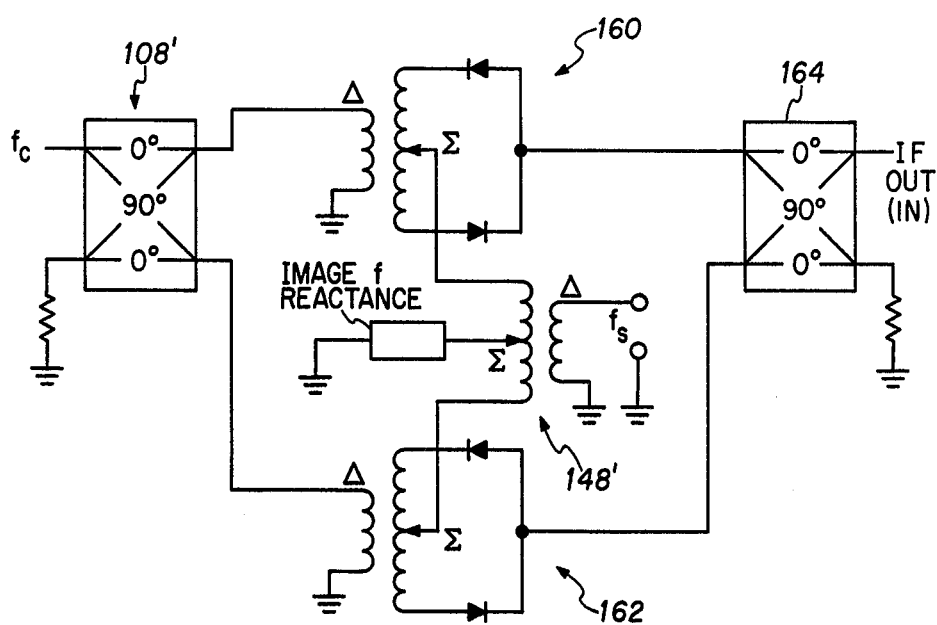
FIG. 5 presents a low frequency electrical equivalent of FIG. 4.

FIG. 5 is an electrical schematic diagram of the circuit of FIG. 4 with the section designated as 108' representing the signal splitter 108 of FIG. 4. The area generally designated as 160 is the balanced mixer utilizing rat-race 114 while the area designated as 162 is a balanced mixer representing the mixer circuit using rat-race 116 of FIG. 4. The two mixers, 160 and 162, are connected to a signal combiner 164 for combining the two intermediate frequency signals. Combiner 164 is substantially identical in electrical representation and effective action to that of 108'. A final section designated as 148' is the signal combining section containing the image frequency reactive termination and the connection to the signal frequency.

As illustrated, FIGS. 4 and 5 are drawn for down-converter operation. The up-converter configuration inputs the IF (as shown in brackets) and obtains $f_s$ as an output signal (shown in brackets in FIG. 40).

OPERATION

Prior art mixers have customarily used a bandpass filter to pass input $f_s$ signals and reflect image frequency signals back to the mixer. In view of the lack of available space in the present layout, a new approach was to be devised. The approach was to use stub 11 and segment 12 to minimize generation of second harmonic signals at diode 16. The beating of the LO signal $f_c$ and the $f_s$ signal in diode 16 produces several product signals of interest including the IF signal (difference), the sum frequency ($f_o + f_s$), $2f_c$ (the largest of the harmonics and potentially most disruptive from a further mixing stand point), and the image frequency signal. Any other signal which beats with the $f_s$ signal to thereby create further components is undesirable as it wastes signal power. The magnitude of the $2f_c$ signal is such that considerable $f_s$ power is lost while generating signal components including the image frequency signal ($2f_c - f_s$). It is an object of this invention to both attempt to suppress generation of $2f_c$ signals and to recover power lost to this generation of image frequency signals to the greatest practical extent. (As known, further image frequency signal components are generated by interaction of $f_c$ and the IF signals. The suppression of these later image frequency signals is not part of this invention. However, the attempted recovery of image frequency power includes these components.) The stub 11 and segment 12 are each one-quarter the wavelength of the second harmonic of the signal $f_c$ or in other words, $\lambda c/8$. The stub 11 combined with $\lambda c/4$ line 13 helps create a virtual ground at the point of connection of lead 13 to the microstrip lead 10 for $2 f_c$ signals. The lead 13 as connected to the ground pattern 14 creates an effective ground potential to IF signals also. The carrier signal $f_c$ is used to switch the diode 16 as previously known in the art. The signal $f_c$, after being passed through diode 16, is further attenuated by the open circuit created by $\lambda c/4$ stub 18. Stub 20 again attenuates the second harmonic signals since this stub 20 is a short circuit to second harmonic signals and acts with segment 19 to effectively place a short circuit at diode 16. The total length of the lead between stub 18 and stub 22 combined with stub 22 creates an open circuit to the basic carrier frequency signals at diode 16. As will be noted, stub 22 is not quite $\lambda c/4$ due to the presence of stub 20 and is thus termed a "fore-shortened stub." The length of this stub is obtained by inputting a sweep RF signal at lead 10 while terminating stub 18 with a matched load and adjusting stub 22 from an initial length of $\lambda c/4$ to the length at which minimum amplitude $f_c$ signals are obtained at output 30. It is desirable to also check for minimum $2 f_c$ signals while making the adjustment to stub 22. Stub 24 acts to further filter $f_c$ and associated frequency band signals from appearing at output 30.

The filter 26 with its three stubs 27, 28 and 29 provides isolation between the previous filters and stub 30 along with its connected loads. The description to date has been for a down-converter.

If the circuit is to be used as an up-converter, the IF signal is applied at lead 30 as an input and is passed through the various filters to diode 16 where it is switched by the action of $f_c$. The IF component is grounded by terminal 14 after it has combined with the local oscillator signal to produce sideband signals.

Thus, the filtering approach and operation of a specific mixer circuit (FIG. 1a) used as a portion of a balanced mixer is relatively straightforward except for the sections used to reduce second harmonic signals.

As previously indicated, FIG. 1b is a low frequency lumped constant schematic presentation illustrating the electrical equivalent of FIG. 1a.

FIG. 2 uses a pair of the mixer portions shown in FIG. 1a to provide a balanced mixer operation somewhat as described in the referenced U.S. Pat. No 3,870,960. Since the operation of a balanced mixer is well known to most people skilled in the art, it is believed sufficient to state that this type of mixer uses a relatively high power local oscillator as compared to the amplitudes of the input and output signals. The use of the rat-race hybrid mixer circuit 40 in a down-converter application permits mixing of the input $f_s$ and $f_c$ signals in the proper phase relationships such that they are output at ports 44 and 48 so as to be rectified also mixed or heterodyned according to some experts by non-linear elements 50 and 56 before being filtered to remove all signals other than the IF signals which are passed through the circuitry to the outputs 54 and 60.

From discussions relative to FIG. 3, it will be realized that image frequency signals are output on lead 42.

In the up-converter configuration, the intermediate frequency signals are applied at terminals 54 and 60 while the carrier signal is applied at port 46 so as to be distributed in the proper phase at ports 44 and 48 to switch the incoming IF signal through the action of diodes 50 and 56. The IF signal is then grounded but the newly created signal $f_s$ is transmitted to the rat-race 40 and output on port 42.

FIG. 4 uses two of the balanced mixed circuits wherein the carrier signal is split in device 108 and applied in quadrature to each of the rat-race hybrids 114 and 116. The input $f_s$ signal is supplied to rat-race 148 wherein it is further distributed in the proper phase on leads 146 and 150 to the rat-races 114 and 116 of their respective mixing circuits. In a down-converter, the image frequency ($f_i$) that is generated on the opposite side of the carrier frequency from the $f_s$ input signal frequency represents half of the input signal power used in the conversion process and the other half is used to provide the IF output signal. The image frequency signals are supplied in-phase on the leads 146 and 150, after the modulation or conversion process, to rat-race 148 where they are combined in stub 154. Stub 154 represents a reactive circuit such that the image frequency signals are reflected back to the two mixers at a phase such that it will add with the signal IF to increase the resultant IF output and as a consequence increase the conversion efficiency.

When this circuit is used as an up-converter, the input IF signal causes two equal level sidebands to be generated on either side of the RF pump carrier which is input on lead 100. Since only one of these sidebands can be utilized, half of the power is wasted in the unused sideband and returns it to the mixer circuits in the proper phase so that it can be relcaimed.

A unique feature of the composite circuit of FIG. 4 is that in a down-converter the stub 154 contains only the frequency products to be returned and thus it an be designed either as a short or an open circuit to reflect the image frequency back to the two balanced mixers and its phase may be changed by changing the electrical length of this line or stub. It may be noted that line 154 appears as an infinite impedance or open circuit to the mixer diodes at the design frequency and this impedance in effective parallel combination with the $f_s$ source impedance produces a high impedance load.

While a primary objective in the design of the circuit was to reduce conversion loss, a further benefit was obtained in a reduction in noise. Although the reasons for the reduction in noise are not completely understood by the applicant, it is believed that it is accomplished as follows. The stub 154 appears to the mixer diodes as an open circuit and thus as an infinite impedance to create the above referenced high impedance load. As known, at the image frequency response, there will be no noise voltage in the presence of a short circuit and no noise current in the presence of an infinite impedance. The present approach apparently obtains a low noise figure by reclaiming the image frequency signal and part of the reflected received signal through the use of stub 154 rather than through the use of the frequency band limiting structures of the prior art. Further, unlike known prior art circuits such as found in U.S. Pat. No. 3,831,097, the image frequency signal is returned to the mixer originally generating the signal wherein a synchronizing or locking effect is obtained to keep or maintain an in-phase relationship between the IF signal components rather than the prior art effect which does not discriminate as to presentation of the returned signals and thus introduces random phase relationships between IF signal components.

FIG. 5 electrically illustrates the actions of FIG. 4 in that a signal $f_c$ is supplied to the signal splitting circuit 108' and then applied to each of the balanced mixers 160 and 162. A receive signal is supplied to these two mixers through the symbolic transformer 148' where it is split to two signals and applied to the balanced mixers. The output image frequency signals are reactively terminated as explained above to increase the efficiency of the balanced modulators which provide separate IF outputs to the combiner 164 wherein the signals are combined and supplied as a single output signal.

While it may not be immediately obvious, a close examination should disclose to those skilled in the art that the presence of a reactive load at the end of line 154 will cause a 3:1 VSWR to appear at the input terminals 146 and 150 of mixer sections 114 and 116. The presence of this VSWR is equivalent to a 50% reflective coefficient which is responsible for reflecting back to mixer sections 114 and 116 one-half of the signal voltage that is initially reflected from mixer diodes 122, 126, 136 and 138, due to diode mismatch between pairs of diodes in individual mixer circuits. The return to the mixer diodes of approximately one-half the reflected received signal voltage will produce an additional decrease in conversion loss of each mixer section substantially identical to that provided by the return of the image frequency signal described previously.

In summary, the present disclosure provides an improved converter by maximizing filtration of signals with a minimum of components in each half of each mixer section, reduces noise by increasing the effective impedance seen by each diode in the mixing circuits and increases signal conversion efficiency by returning the image frequency signals and reflected receive signals to the mixer diodes in-phase with incoming signals for further processing.

While one embodiment of the inventive concept has been illustrated, it will be apparent to those skilled in the art that this concept can be implemented in other ways and I wish to be limited only by the scope of the appended claims.

What is claimed is:

1. Frequency conversion apparatus comprising, in combination:
   signal splitter means, including input means and first and second output means;
   means for supplying local oscillator signals to said input means of said splitter means;
   first and second mixer means, each including first, second and third terminal means;
   180° signal hybrid means, including first, second and third hybrid terminal means and signal termination means, for affecting the phase of signals, applied to one of said hybrid terminal means and transmitted to others of said hybrid terminal means, in a predetermined manner wherein a signal applied to said third hybrid terminal means will appear at said first and second hybrid terminal means with substantially a 180° phase difference therebetween and cancel at said signal termination means;
   means connecting said first output means of said signal splitter means to said first terminal means of said first mixer means;
   means connecting said second output means of said signal splitter means to said first terminal means of said second mixer means;
   means connecting said second terminal means of said first mixer means to said first hybrid terminal means of said hybrid means;
   means connecting said second terminal means of said second mixer means to said second hybrid terminal means of said hybrid means;
   means for supplying input signals to be converted to said third terminal means of one of said hybrid means or the pair of mixer means; and
   means for receiving converted output signals from the remaining third terminal means.

2. Apparatus as claimed in claim 1 wherein:
   the output signals are single sideband;
   said mixer means each utilize a microstrip 180° hybrid ring; and
   said signal termination means is a short circuit.

3. Apparatus as claimed in claim 1 wherein the signals appearing at said first hybrid terminal means are phase shifted substantially 90° with respect to signals input at said third hybrid terminal means and comprising, in addition:
   diode means incorporated in each of said mixer means; and
   reactive means coacting with said termination means to cause an effective reactive impedance to be seen by each diode means at the image frequency response.

4. The method of increasing the efficiency of a microwave frequency converter having a pair of hybrid mixers feeding an image frequency signal to ports of a 180° hybrid combiner comprising the steps of:
   terminating the image frequency and reflected received signals at a port of said combiner which is equidistant in phase from ports receiving said image frequency signals from said mixers; and
   returning the image frequency and reflected received signals to said pair of mixers to reduce conversion losses therein.

5. The method of increasing the efficiency of a microwave frequency converter having a pair of hybrid mixers incorporating diodes operating to reflect received signals to ports of a 180° hybrid combiner comprising the steps of:
   terminating reflected received signals at one port of said combiner which is equidistant in phase from the ports thereof receiving said reflected received signals from said mixers; and
   returning approximately 50% of the reflected signal voltage created by mixer diode mismatch to the diodes of said mixers to reduce conversion losses therein.

6. Microstrip mixer apparatus comprising, in combination:
   first signal terminal means for supplying local oscillator signals at a frequency $f_c$;
   first stub means of length $\lambda c/8$ connected to one end of said first signal terminal means where $\lambda c/8$ is one-eighth the wavelength of the frequency of signal $f_c$;
   first connection means of length $\lambda c/8$ connected to said first signal terminal means;
   ground means connected to said one end of said first signal terminal means by lead means of length $\lambda c/4$;
   second stub means of length $\lambda c/4$;

diode means connected between said second stub means and said first connection means;

third stub means of length $\lambda c/8$;

second connection means connecting said second stub means to said third stub means at a distance of $\lambda c/8$;

fourth stub means of length slightly less than $\lambda c/4$;

third connection means connecting said third stub to said fourth stub means wherein the distance from second stub means to said fourth stub means is equivalent to $\lambda c/4$;

fifth stub means of length $\lambda c/4$;

fourth connection means connecting said fifth stub means to fourth stub means at a distance of $\lambda c/4$ therefrom;

RF filter means for attenuating signal frequency $f_s$ electrical components;

fifth connection means connecting said RF filter means to said fifth stub at a distance of $\lambda c/4$;

intermediate frequency terminal means; and sixth connection means connecting said RF filter means to said intermediate frequency terminal means.

7. A balanced mixer signal frequency converter comprising, in combination:

first and second hybrid balanced mixer means for mixing a plurality of signals each including diode means;

180° hybrid combiner means connected to each of said first and second mixer means; and reactive termination means connected to said combiner means at an equiphasedistant position from said mixer means connections for effecting a partially reactive impedance as seen by said diode means at the image frequency response.

8. In a balanced mixer frequency converter using a local oscillator signal splitter feeding a pair of hybrid balanced mixer circuits each having an intermediate frequency terminal with a 180° hybrid combiner connected to each of said mixer circuits and the combiner having a signal frequency ($f_s$) terminal, an image frequency signal being generated in each of said mixer circuits and transmitted to said combiner, the improvement comprising:

termination means incorporated into said combiner for returning both said image frequency and reflected received signals to each of said mixer circuits in the same phase as the signals were supplied to the combiner to reduce effective conversion losses in said converter.

* * * * *

UNITED STATES PATENT AND TRADEMARK OFFICE
CERTIFICATE OF CORRECTION

PATENT NO. : 4,099,126
DATED : 07/04/78
INVENTOR(S) : Ben R. Hallford

It is certified that error appears in the above–identified patent and that said Letters Patent are hereby corrected as shown below:

In the Abstract
Line 5, delete "receiver" and substitute therefor -- receive--,

Column 1, line 31, after "equal" insert --power--.
Column 2, line 4, delete "electircl" and substitute therefor --electrical--.
Column 2, line 11, after "basis" insert --such--.
Column 2, line 60, delete "in site" and substitute therefor --in spite--.
Column 3, line 5, delete "electrica" and substitute therefor --electrical--.
Column 3, line 7, delete "of" and substitute therefor --or--.
Column 3, line 44, delete "rms" and substitute therefor --arms--.
Column 3, line 58, after "to" insert --a--.
Column 4, line 21, after "LO" insert --signal--.
Column 4, line 59, delete "$f_o$" and substitute therefor --$f_c$--.

Column 6, line 11, delete "mixed" and substitute therefor --mixer--.
Column 6, line 40, delete "an" and substitute therefor --can--.
Column 8, line 63, delete the colon ":" and substitute therefor a semicolon --;--.

Signed and Sealed this

Nineteenth Day of December 1978

[SEAL]

Attest:

RUTH C. MASON
Attesting Officer

DONALD W. BANNER
Commissioner of Patents and Trademarks